(12) United States Patent
Morris et al.

(10) Patent No.: US 10,292,290 B2
(45) Date of Patent: May 14, 2019

(54) COORDINATING INSTALLATION AND CONNECTION OF A MOTOR CONTROL CENTER SUBUNIT HAVING MOVEABLE LINE CONTACTS

(71) Applicant: Eaton Corporation, Cleveland, OH (US)

(72) Inventors: Robert A. Morris, Fayetteville, NC (US); Scott E. McPherren, Chico, CA (US); Daniel J. Leeman, Fuquay-Varina, NC (US)

(73) Assignee: Eaton Intelligent Power Limited, Dublin (IE)

( * ) Notice: Subject to any disclaimer, the term of this patent is extended or adjusted under 35 U.S.C. 154(b) by 1262 days.

(21) Appl. No.: 14/467,967

(22) Filed: Aug. 25, 2014

(65) Prior Publication Data

US 2014/0362498 A1  Dec. 11, 2014

Related U.S. Application Data

(63) Continuation of application No. 11/694,494, filed on Mar. 30, 2007, now Pat. No. 8,817,454, which is a (Continued)

(51) Int. Cl.
| | |
|---|---|
| *H02B 1/36* | (2006.01) |
| *H05K 7/02* | (2006.01) |
| *F02D 11/02* | (2006.01) |
| *F02D 29/06* | (2006.01) |
| *H02B 11/133* | (2006.01) |

(Continued)

(52) U.S. Cl.
CPC ............. *H05K 7/02* (2013.01); *F02D 11/02* (2013.01); *F02D 29/06* (2013.01); *H02B 1/20* (2013.01); *H02B 1/36* (2013.01); *H02B 11/133* (2013.01); *H05K 5/0208* (2013.01); *H02B 11/24* (2013.01)

(58) Field of Classification Search
None
See application file for complete search history.

(56) References Cited

U.S. PATENT DOCUMENTS 2,914,707 A   11/1959  Timmerman
2,921,998 A *  1/1960  Pokorny ............... H02B 11/00
                                                    200/50.22

(Continued)

FOREIGN PATENT DOCUMENTS

DE         10006427 C2    8/2001

*Primary Examiner* — Courtney L Smith
*Assistant Examiner* — Jessey R Ervin
(74) *Attorney, Agent, or Firm* — Ziolkowski Patent Solutions, Group, SC

(57) ABSTRACT

A system and method are provided for coordinating the installation and removal a motor control center subunit with the power connection and interruption thereof. A system of interlocks and indicators causes an operator to install a motor control center subunit into a motor control center, and connect supply and control power thereto, in a particular order. Embodiments of the invention may prevent actuation of line contacts of the bucket, and shield the line contacts, until the bucket is fully installed in the motor control center. Other embodiments also prevent circuit breaker closure until the line contacts are engaged with a bus of the motor control center.

20 Claims, 14 Drawing Sheets

Related U.S. Application Data continuation-in-part of application No. 11/625,088, filed on Jan. 19, 2007, now Pat. No. 7,688,572.

(60) Provisional application No. 60/833,380, filed on Jul. 26, 2006.

(51) Int. Cl.
  *H02B 1/20* (2006.01)
  *H05K 5/02* (2006.01)
  *H02B 11/24* (2006.01)

(56) References Cited

U.S. PATENT DOCUMENTS

| | | | |
|---|---|---|---|
| 3,052,769 A * | 9/1962 | Kuhar et al. | H01H 9/10 200/50.2 |
| 3,089,928 A | 5/1963 | Rexroad | |
| 3,213,222 A | 10/1965 | Finley et al. | |
| 3,288,956 A * | 11/1966 | Jencks | H01H 9/10 200/50.23 |
| 3,303,395 A | 2/1967 | Eck | |
| 3,308,348 A | 3/1967 | Olashaw et al. | |
| 3,363,147 A | 1/1968 | Cataldo et al. | |
| 3,469,043 A | 9/1969 | Wilson | |
| 3,482,143 A | 12/1969 | Stark et al. | |
| 3,495,135 A | 2/1970 | Paape | |
| 3,610,850 A | 10/1971 | Eichelberger | |
| 3,626,253 A | 12/1971 | Sturdivan | |
| 3,633,075 A | 1/1972 | Hawkins | |
| 3,749,862 A | 7/1973 | Wilson et al. | |
| 3,778,568 A | 12/1973 | Wilson | |
| 3,896,353 A | 7/1975 | Burton et al. | |
| 3,920,939 A | 11/1975 | Ciboldi et al. | |
| 4,024,441 A | 5/1977 | Coyle et al. | |
| 4,025,747 A | 5/1977 | Bharteey et al. | |
| 4,025,826 A | 5/1977 | Wilson et al. | |
| 4,034,169 A | 7/1977 | Armstrong et al. | |
| 4,038,585 A | 7/1977 | Wolski et al. | |
| 4,068,287 A | 1/1978 | Kruzic et al. | |
| 4,077,687 A | 3/1978 | Farag | |
| 4,086,452 A | 4/1978 | Collins | |
| 4,090,230 A | 5/1978 | Fuller et al. | |
| 4,118,607 A | 10/1978 | Shaffer | |
| 4,121,276 A | 10/1978 | Kovatch et al. | |
| 4,178,624 A | 12/1979 | Wilson et al. | |
| 4,180,845 A | 12/1979 | Shariff et al. | |
| 4,183,073 A | 1/1980 | Clausing | |
| 4,205,207 A | 5/1980 | Clausing | |
| 4,233,643 A | 11/1980 | Iverson et al. | |
| 4,236,189 A | 11/1980 | Yosida | |
| 4,285,026 A | 8/1981 | Clausing | |
| 4,292,661 A | 9/1981 | Johnson et al. | |
| 4,305,114 A | 12/1981 | Takagi et al. | |
| 4,355,269 A | 10/1982 | Burton et al. | |
| 4,427,854 A | 1/1984 | Kleinecke et al. | |
| 4,443,676 A | 4/1984 | Castonguay | |
| 4,447,682 A | 5/1984 | Castonguay | |
| 4,447,858 A | 5/1984 | Farag et al. | |
| 4,448,450 A | 5/1984 | Kleinecke et al. | |
| 4,486,815 A | 12/1984 | Takahashi | |
| 4,489,362 A | 12/1984 | Castonguay et al. | |
| 4,502,097 A | 2/1985 | Takahashi | |
| 4,565,908 A | 1/1986 | Bould | |
| 4,621,303 A | 11/1986 | Rowe | |
| 4,652,966 A | 3/1987 | Farag et al. | |
| 4,693,132 A | 9/1987 | Buxton et al. | |
| 4,703,137 A | 10/1987 | Bohnen et al. | |
| 4,713,501 A | 12/1987 | Herrmann | |
| 4,720,769 A | 1/1988 | Raabe et al. | |
| 4,728,757 A | 3/1988 | Buxton et al. | |
| 4,743,715 A | 5/1988 | Gerbert-Gaillard et al. | |
| 4,760,220 A | 7/1988 | Fritsch et al. | |
| 4,768,967 A | 9/1988 | Fritsch | |
| 4,789,344 A | 12/1988 | Fritsch et al. | |
| 4,789,919 A * | 12/1988 | Cox | H02B 11/133 200/50.07 |
| 4,814,942 A | 3/1989 | Robirds et al. | |
| 4,853,830 A | 8/1989 | Corfits et al. | |
| 4,860,161 A * | 8/1989 | Maki | H02B 1/36 200/50.17 |
| 4,914,549 A | 4/1990 | Leone et al. | |
| 4,926,286 A * | 5/1990 | Maki | H02B 1/14 200/50.17 |
| 4,937,403 A | 6/1990 | Minoura et al. | |
| 5,006,682 A | 4/1991 | Sloff et al. | |
| 5,019,676 A | 5/1991 | Heckenkamp | |
| 5,124,881 A | 6/1992 | Motoki | |
| 5,130,616 A | 7/1992 | Owen | |
| 5,322,971 A | 6/1994 | Owen | |
| 5,337,210 A | 8/1994 | Ishikawa et al. | |
| 5,343,355 A | 8/1994 | Ishikawa | |
| 5,424,910 A | 6/1995 | Lees | |
| 5,424,911 A | 6/1995 | Joyner et al. | |
| 5,459,293 A * | 10/1995 | Hodkin | H02B 11/12 200/50.26 |
| 5,481,075 A | 1/1996 | Kleinecke et al. | |
| 5,486,663 A * | 1/1996 | Fritsch | H01H 9/22 200/50.21 |
| 5,486,978 A | 1/1996 | Fishovitz | |
| 5,495,388 A | 2/1996 | Bonetti et al. | |
| 5,510,960 A | 4/1996 | Rosen | |
| 5,515,236 A | 5/1996 | Nolan et al. | |
| 5,530,414 A | 6/1996 | Reynolds | |
| 5,539,614 A | 7/1996 | Ishikawa et al. | |
| 5,568,033 A | 10/1996 | Brunson | |
| 5,592,360 A | 1/1997 | Beck et al. | |
| 5,623,135 A | 4/1997 | Hashimoto et al. | |
| 5,625,531 A | 4/1997 | Padilla et al. | |
| 5,642,256 A | 6/1997 | Pugh et al. | |
| 5,691,686 A | 11/1997 | Ishikawa et al. | |
| 6,005,208 A | 12/1999 | Castonguay | |
| 6,015,958 A | 1/2000 | Pomatto et al. | |
| 6,031,192 A | 2/2000 | Liebetruth | |
| 6,087,602 A | 7/2000 | Bernier et al. | |
| 6,141,206 A | 10/2000 | Bruner et al. | |
| 6,207,909 B1 | 3/2001 | Tallman et al. | |
| 6,284,989 B1 | 9/2001 | Bernier et al. | |
| 6,301,094 B1 | 10/2001 | Soares et al. | |
| 6,388,868 B1 | 5/2002 | Leccia et al. | |
| 6,414,839 B1 | 7/2002 | Derksen | |
| 6,423,913 B1 | 7/2002 | Gupta et al. | |
| 6,433,999 B1 | 8/2002 | Muse et al. | |
| 6,435,631 B1 | 8/2002 | Yee et al. | |
| 6,512,669 B1 | 1/2003 | Goodwin et al. | |
| 6,531,670 B1 | 3/2003 | Pugh | |
| 6,545,859 B2 | 4/2003 | Leccia | |
| 6,551,111 B1 | 4/2003 | Watanabe | |
| 6,700,062 B1 | 3/2004 | Allen, Jr. | |
| 6,717,076 B2 | 4/2004 | Narusevicius et al. | |
| 6,831,226 B2 | 12/2004 | Allen, Jr. | |
| 6,861,596 B2 | 3/2005 | Schnackenberg | |
| 6,864,443 B1 | 3/2005 | Bruchmann | |
| 6,878,891 B1 | 4/2005 | Josten et al. | |
| 6,951,990 B1 | 10/2005 | Miller | |
| 7,019,230 B1 | 3/2006 | Vaill et al. | |
| 7,292,422 B2 | 11/2007 | Culligan et al. | |
| 7,311,538 B2 | 12/2007 | West | |
| 7,337,450 B2 | 2/2008 | Sato et al. | |
| 7,440,259 B1 | 10/2008 | Deylitz et al. | |
| 7,466,554 B2 | 12/2008 | Matsumoto et al. | |
| 7,525,809 B2 | 4/2009 | Bergmann et al. | |
| 7,544,908 B2 | 6/2009 | Webb et al. | |
| 7,688,572 B2 * | 3/2010 | Yee | H02B 1/36 200/50.08 |
| 2001/0012194 A1 | 8/2001 | Soares et al. | |
| 2002/0021548 A1 | 2/2002 | Muse et al. | |
| 2003/0116413 A1 | 6/2003 | Narusevicius et al. | |
| 2003/0117045 A1 | 6/2003 | Byron et al. | |
| 2003/0119344 A1 | 6/2003 | Byron et al. | |
| 2003/0119352 A1 | 6/2003 | Byron et al. | |
| 2003/0119382 A1 | 6/2003 | Narusevicius et al. | |
| 2004/0166729 A1 | 8/2004 | Allen, Jr. | |
| 2004/0201972 A1 | 10/2004 | Walesa | |

(56) References Cited

U.S. PATENT DOCUMENTS

| | | |
|---|---|---|
| 2005/0070166 A1 | 3/2005 | Brandt et al. |
| 2006/0067018 A1 | 3/2006 | Malkowski, Jr. et al. |
| 2006/0120026 A1 | 6/2006 | Wiant et al. |
| 2007/0109731 A1 | 5/2007 | Bergmann et al. |
| 2007/0111575 A1 | 5/2007 | Jensen et al. |
| 2009/0258667 A1 | 10/2009 | Suzuki et al. |

\* cited by examiner

COORDINATING INSTALLATION AND CONNECTION OF A MOTOR CONTROL CENTER SUBUNIT HAVING MOVEABLE LINE CONTACTS

CROSS-REFERENCE TO RELATED APPLICATIONS

The present invention is a continuation of and claims the benefit of U.S. Ser. No. 11/694,494, filed on Mar. 30, 2007, which is a continuation-in-part of and claims the benefit of U.S. Ser. No. 11/625,088, filed on Jan. 19, 2007, now U.S. Pat. No. 7,688,572, which claims the benefit of U.S. provisional application Ser. No. 60/833,380, filed Jul. 26, 2006, the disclosures of which are incorporated herein by reference.

BACKGROUND OF THE INVENTION

The present invention relates generally to motor control systems, and more particularly, to a motor control center subunit having an interlock system which governs the connection of motor control components to supply power. In one embodiment, the system and method described herein coordinate the connection of supply power to the motor control components to occur only after full installation of the motor control center subunit into the motor control center.

A motor control center is a multi-compartment steel enclosure with a bus system to distribute electrical power, on a common bus system, to a plurality of individual motor control units mountable within the compartments. The individual motor control center subunits are commonly referred to as "buckets" and are typically constructed to be removable, pull-out units that have, or are installed behind, individual sealed doors on the motor control center enclosure. These buckets may contain various motor control and motor protection components such as motor controllers, starters, contactor assemblies, overload relays, circuit breakers, motor circuit protectors, various disconnects, and similar devices for electric motors. The buckets connect to the supply power lines of the motor control center and conduct supply power to the line side of the motor control devices, for operation of motors. Motor control centers are most often used in factories and industrial facilities which utilize high power electrical motors, pumps, and other loads.

Typically, when installing or removing motor control center buckets, the power supply lines are connected. To remove such a bucket, a deadfront door of the bucket or of the motor control center is opened and an operator manually pulls on the bucket to separate the primary disconnects, or "stabs," from the bus system, thereby disconnecting the power supply. Installation of a bucket is accomplished in a similar manner, wherein the operator manually pushes the bucket into a compartment of the motor control center to engage the bucket stabs with the bus system, thus connecting the system to supply power. The line connections or stabs may be difficult to maneuver manually when an operator is supporting the entire bucket or when the stabs are not visible.

Attempts have been made to improve upon the manual installation and disconnection of motor control center buckets and supply power connections from live supply power lines, risers, and/or a vertical bus of a motor control center. Other systems have employed pivotable handles inside the buckets to pivot line connectors to and from supply lines. However, many of these systems require that the bucket or compartment door be open to manipulate the handles and line stabs.

It would therefore be desirable to design a motor control center bucket assembly that overcomes the aforementioned drawbacks. Thus, it would be desirable to provide for remote connection or disconnection of the line stabs of a bucket to the power supply lines or bus of a motor control center from a distance. In the event of an arc or arc flash, any heated gas, flame, and/or the arc itself should preferably be contained behind the bucket compartment door or "deadfront."

BRIEF DESCRIPTION OF THE INVENTION

The present invention provides a system and method for installing a motor control center subunit or bucket into a motor control center and electrically connecting motor control components of the bucket to a power supply. The system and method utilize moveable line stabs to engage the power supply (such as a series of bus bars) after the bucket has been secured in the motor control center, in order to contain potential arc flashes. An arrangement of interlocks coordinates the connection of supply power with installation and removal of the bucket.

Therefore, in accordance with one aspect of the present invention, a motor control center subunit is disclosed. The subunit includes a housing configured to fit within a motor control center and an actuating mechanism attached to the housing and constructed to move at least one conductive contact to engage and disengage a supply power of the motor control center. The subunit also includes an interlock system arranged to coordinate installation of the subunit housing into the motor control center with connection of the supply power to motor control components of the subunit housing.

In accordance with another aspect of the invention, a motor control center is provided having a frame, a subunit, an actuating mechanism, and an interlock. The motor control center frame has at least one compartment into which the motor control center's subunit is constructed to seat. The actuating mechanism is attached to the subunit to control movement of a plurality of conductive contacts. However, the interlock is configured to prevent actuation of the actuating mechanism until the motor control center subunit is seated in the compartment.

According to a further aspect of the invention, a method of manufacturing an interlock system for a motor control center is disclosed. The method includes constructing a motor control center subunit to seat within a motor control center. Engagement of a plurality of movable contacts of the motor control center subunit with a supply bus of the motor control center is restricted, dependent upon a state of at least one interlock.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

The following description makes reference to supply power, supply power lines, motor power, load power, line power, and the like. It is appreciated that such terms may refer to a variety of both common and uniquely conditioned voltage and current characteristics, including but not limited to, three phase AC power, single phase AC power, DC power, multiple DC power lines, or any combination thereof. Such power characteristics will be generally referred to as being provided on a bus, supply line, or riser of a motor control center. However, it is appreciated that the present invention may find applicability in other power connectivity configurations, adapted or apart from motor control centers. An example of supply power commonly used in motor control centers is 480V three-phase AC power distributed over three separate supply bus bars. In addition, references to "motor control components" shall be understood to include the various types of devices and control components which may be housed in a motor control center bucket for connection to the supply power. Such devices and components include contactors, relays, motor controllers, disconnects, circuit protective devices, and the like.

Figure 1:
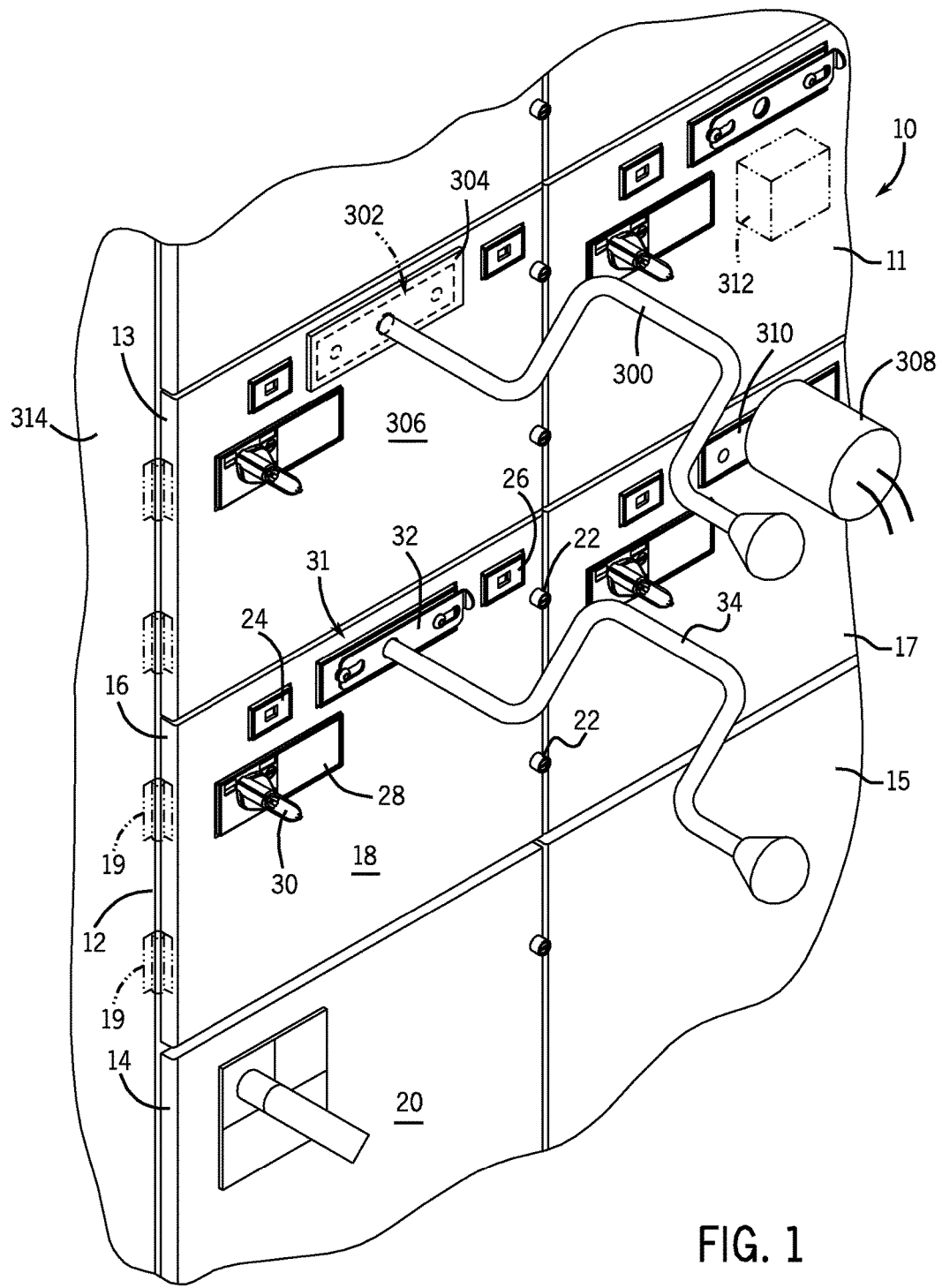
FIG. 1 is a partial perspective view of a number of motor control center subunits installed in a motor control center.

Referring to FIG. 1, a partial perspective view of a motor control center structure 10 is shown. As discussed above, motor control centers are generally formed of a frame 314 that may include compartments or enclosures for multiple control modules or buckets 11, 13, 14, 15, 16, 17. Bucket 16 is shown fully installed into motor control center compartment or enclosure 12 such that its front panel 18 is seated securely against the periphery of enclosure 12 and flush with the front panel 20 of bucket 14. In this regard, bucket 16 includes a number of latching mechanisms 22 on front panel 18 so that an operator may lock bucket 16 into place once installed. In some embodiments, front panel 18 may be a deadfront door having a set of hinges 19 in order to permit access to motor control components within bucket 16 while bucket 16 is installed in enclosure 12 of motor control center 10. However, even when closed or sealed, front panel or door 18 still permits access to circuit breaker assembly 28, stab indicator 24, shutter indicator 26, and line contact actuator 31. Line contact actuator 31 is a mechanism for engaging line contacts (FIG. 2) with line power from the motor control center 10. Thus, even when bucket 16 is fully installed in enclosure 12 and latches 22 have been secured, an operator may still use disconnect handle 30 and may open slide 32 to insert crank 34 to move one or more line contacts (not shown) of the bucket 16. When slide 32 is moved aside to permit access to actuating mechanism 31, door 18 is prevented from opening, thereby closing off access to components inside bucket 16. Additionally, a user may desire to padlock the slide 31 in the closed position, to further regulate who may operate actuating mechanism 31 and when.

In other embodiments, a crank 300 for actuating an actuating assembly 302 may include a flange 304 which abuts a front door 306 of a bucket 13 when the crank 300 is connected to the actuating assembly 302 thereof. Because the flange 304 extends further than the actuating assembly 302 and overlaps front door 306, flange 304 acts as an interlock to prevent door 306 from opening when the crank 300 is connected for operation of actuating assembly 302.

As an alternative to, or in combination with, using a hand crank, a motor drive 308 may be used to operate an actuating assembly 310 of a bucket 17. Such a motor drive 308 may be connected permanently or removably to actuating assembly 310. Preferably, motor drive 308 is a DC motor remotely operable from distances of 10-50 ft, whether wirelessly or with a wired controller. Motor drive 308 may be powered by a battery or by an electrical connection with motor control center 10, such as via the control power contact 44 shown in FIG. 2 or a similar plug or connection. It is recognized, however, that many other types, sizes, and configurations of motor drive 308 are equivalently applicable. For example, it may be desirable to connect a motor drive 312 inside a bucket, as shown with bucket 11. In addition, an interlock circuit may be included (not shown) to only allow operation of the motor drive 308, 312 when the bucket 11, 17 is installed in motor control center 10. This may be as simple as a contact switch that completes an input power circuit or may include more sophisticated position sensors or latch sensors.

Figure 2:
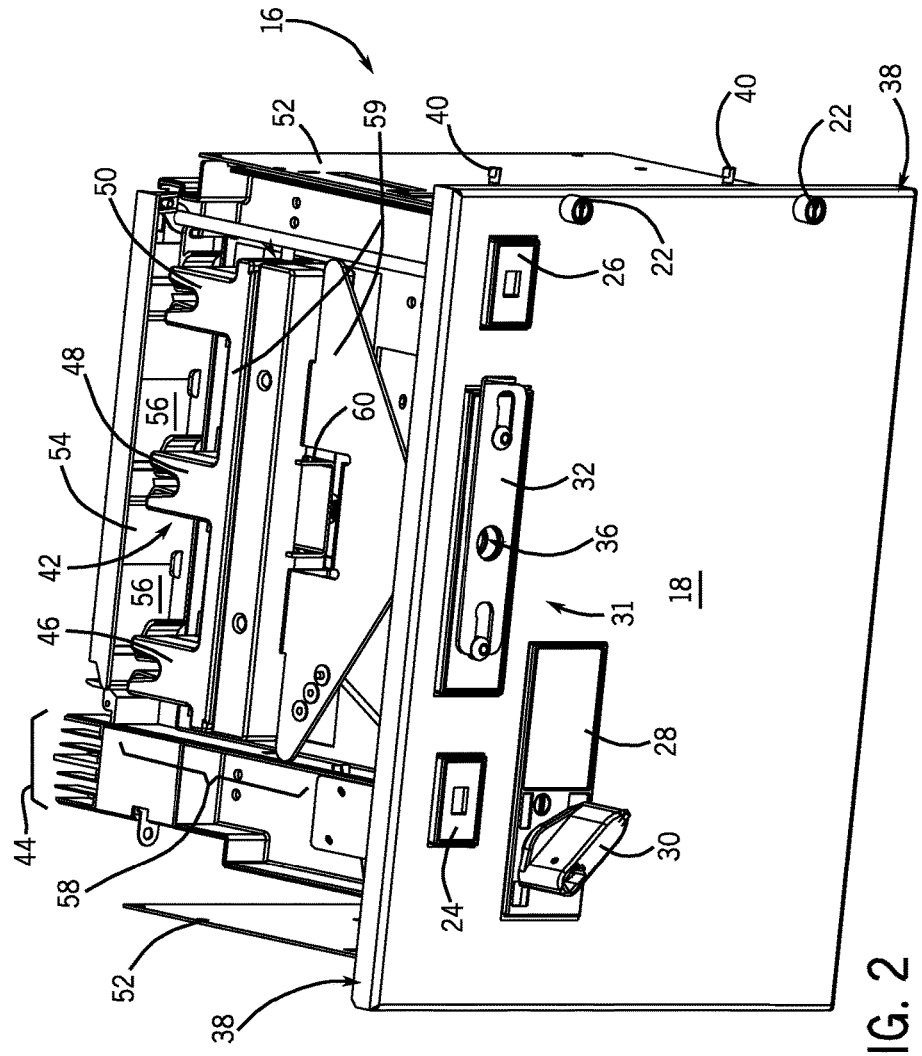
FIG. 2 is a perspective view of a motor control center subunit of FIG. 1, removed from the motor control center.

Referring now to FIG. 2, a perspective view of a motor control center bucket 16 is shown. It is noted that bucket 16 may have a housing that includes a number of panels surrounding bucket 16 to fully or partially enclose the components thereof. As shown, bucket 16 includes a pair of side panels 52 and a front panel 18, which support motor control devices and internal bucket components. An upper panel and a rear panel have been removed to show the internal components of bucket 16. Front panel 18 is configured to fit snugly and securely within a motor control center such that a rim 38 of the front panel 18 seats against the inner periphery (not shown) of a motor control center enclosure. For purposes of dust protection, rim 38 may optionally include a compressible or flexible seal, such as a rubber seal, or other gasket-type component. Once bucket 16 is inserted into a motor control center enclosure, latch mechanisms 22 may be turned with a key, a screwdriver, or by hand so that latch arms 40 abut an inner surface of the outer periphery (not shown) of an enclosure to hold bucket 16 in place and/or prevent bucket 16 from being removed. Similarly, an automatic retention latch 60 is shown in an engaged position. Upon advancement of line contacts or stabs 46, 48, 50 automatic retention latch 60 is triggered to engage a frame or divider pan (FIG. 7) that segregates upper and lower compartments of the motor control center unit in which bucket 16 is installed.

When slide 32 of line contact actuator 31 is moved aside, an opening 36 is exposed. Opening 36 preferably has a unique configuration to accept a specialized crank 34 (as shown in FIG. 1). Additionally, when slide 32 is moved aside as shown, slide 32 extends over a portion of front panel 18. Thus, in embodiments in which front panel 18 is a hinged door, moving slide 32 to expose opening 36 will inhibit a user from opening front panel 18. Accordingly, so long as an operator has a crank inserted into opening 36 of actuator 31, the operator cannot open the door of the bucket 16.

Bucket 16 also includes a number of conductive contacts or stabs 44, 46, 48, 50. Control power contact 44 is preferably fixedly attached to the rear of bucket 16, whereas supply power stabs 46, 48, 50 are moveable with respect to bucket 16. However, it is appreciated that control power contact 44 may also be moveable in a similar manner to line power stabs 46, 48, 50. Control power contact 44 is of a suitable construction to conduct a control power (typically a few volts) to motor control components (not shown) disposed within bucket 16. In embodiments where control power contact 44 is permanently positioned at the rear of bucket 16, control power contact 44 will engage a control power supply line or bus upon installation of bucket 16 into a motor control center.

Supply power stabs 46, 48, 50, on the other hand, do not initially engage supply power lines or buses when bucket 16 is installed into a motor control center. Rather, stabs 46, 48, 50 are initially in retracted position 42, disposed inside bucket 16. One skilled in the art will appreciate that a number of configurations of supply power stabs 46, 48, 50 may be utilized. In the embodiment shown, stabs 46, 48, 50 are shaped to grasp about a supply line, bus, or riser of the motor control center 10 of FIG. 1.

The stab assembly 58, in addition to stabs 46, 48, 50, also includes a stab bracket 59 to which the stabs 46, 48, 50 are attached. Stab bracket 59 holds stabs 46, 48, 50 in an orientation for subsequent engagement with the supply power lines or buses of motor control center 10 of FIG. 1. It is recognized, however, that stab assembly 58 of FIG. 2 may include any number of configurations, such as for independently moveable stabs, for other than three stabs, or for actuation by other than a shaft, as will be described below. A shutter or isolator assembly 54 is disposed in the rear of bucket 16, between stab assembly 58 and the exterior of bucket 16. Isolator assembly 54 includes a number of moveable shutters 56 which operate to either expose or isolate the stabs 46, 48, 50 from the power lines or buses of the motor control center 10 of FIG. 1.

Figure 3:
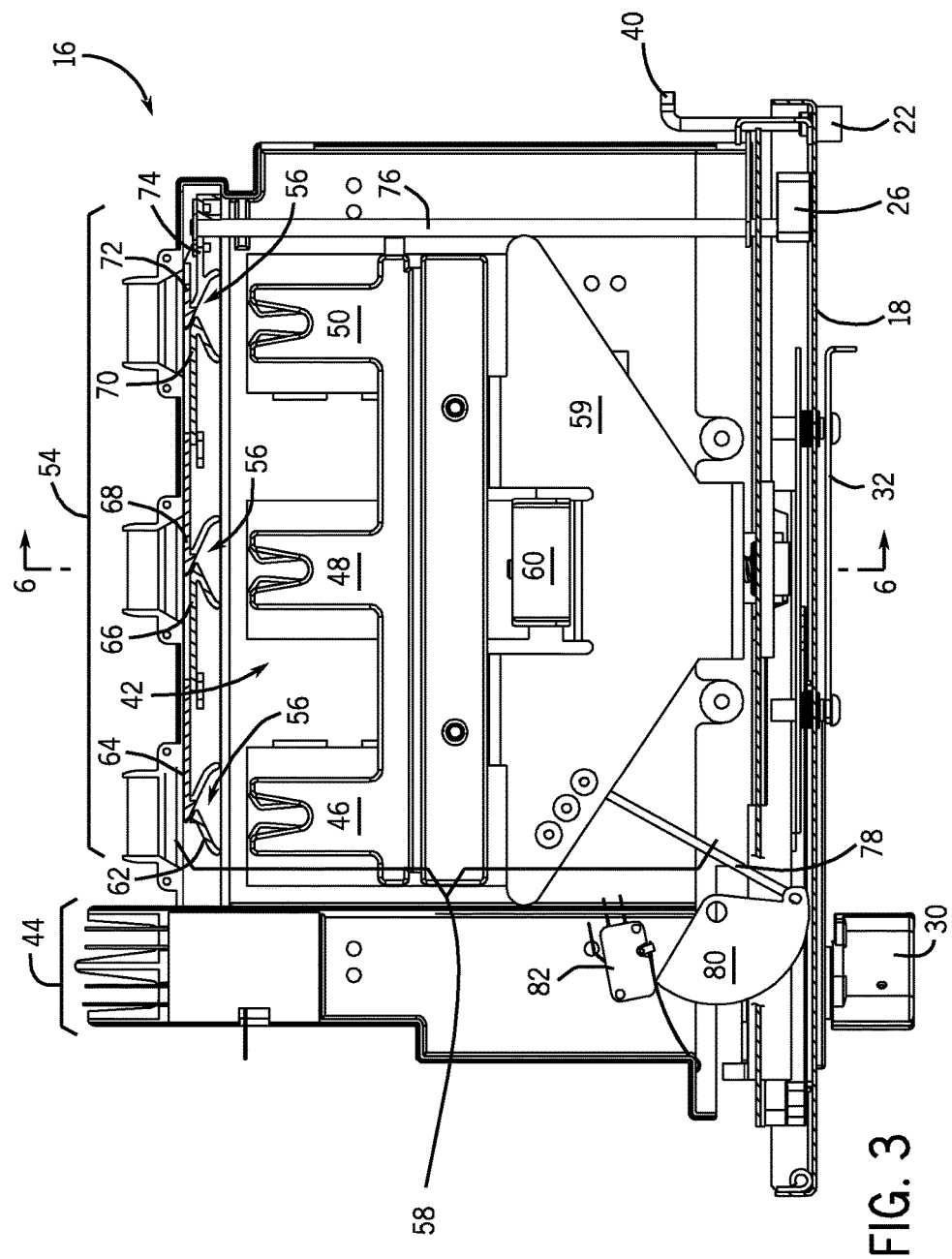
FIG. 3 is a top view of the motor control center subunit of FIG. 1 showing a number of stabs in a refracted position.

FIG. 3 depicts a top view of bucket 16, with all housing panels removed except for front panel or door 18. As shown, stab assembly 58 has positioned stabs 46, 48, 50 in a retracted position 42 wherein the stabs 46, 48, 50 are located inside bucket 16. Accordingly, shutters 56 of shutter assembly 54 are closed, isolating the stabs 46, 48, 50 from the supply power bus or line of a motor control center such as shown in FIG. 1. As shown in FIG. 3, each shutter 56 includes two separate shielding members 62 and 64, 66 and 68, 70 and 72. The shutter 56 for stab 46 includes a left shielding portion 62 and a right shielding portion 64, each being angled toward stab 46. Likewise the shutters 56 for stabs 48 and 50 include left shielding portions 66, 70 and right shielding portions 68, 72 respectively, each being angled toward the corresponding stab. However, the shutter 56 for stab 50 includes an additional mechanical connection 74. That is, a shutter arm 74 is provided to control a shutter indicating mechanism 76 which displays to an operator via front panel indicator 26 whether the shutters 56 are open or closed, as will be described in further detail below. Similarly, a cam or bell crank 80 is attached via rod 78 to stab assembly 58 to translate movement of the stab to a microswitch 82. Microswitch 82 operates to turn on and off the supply of control power from control power contact 44 to motor control components, such as contactors or overload relays (not shown), of bucket 16.

Figure 4:
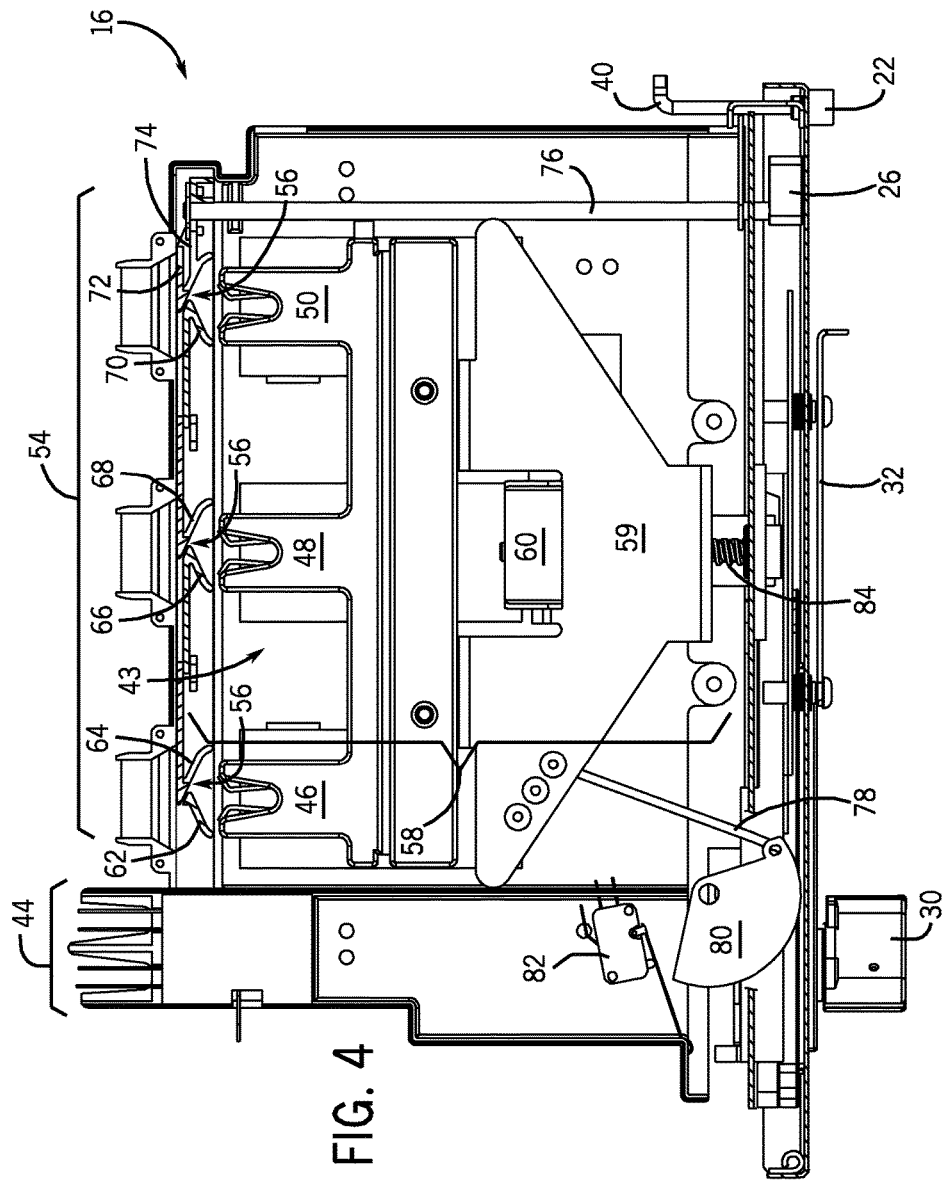
FIG. 4 is top view of the motor control center subunit of FIG. 3 showing the stabs in a test position.

Referring now to FIG. 4, the bucket 16 is shown having the stab assembly 58 in a test position 43. Stabs 46, 48, and 50 have been advanced to a point or test position 43 at which they nearly touch or just touch shutters 56, but shutters 56 are still closed. Since shutters 56 are closed, stabs 46, 48, 50 are isolated from supply power buses, thus preventing arcs from occurring between stabs 46, 48, 50 and the buses. Being in the test position, stab bracket 59 is moved forward such that actuating shaft or drive 84 is visible. Preferably, shaft 84 is a rotary drive shaft and is connected to the socket of opening 36 shown in FIG. 2 for operation via crank 34, shown in FIG. 1. Referring back to FIG. 4, during the advancement of stab assembly 58, automatic latch 60 has been triggered to engage the enclosure of the motor control center into which bucket 16 has been installed. Also due to the advancement of stab assembly 58, rod 78 is pulled by stab bracket 59 such that cam 80 has rotated away from microswitch 82. Microswitch 82 is thus actuated to permit control voltage from the control power contact 44 to a motor control component, such as a contactor or overload relay (not shown). It is appreciated, however, that microswitch 82, cam 80 and rod 78 are optional. In other words, embodiments of the present invention may simply permit control voltage to pass through control power contact 44 directly to motor control components immediately upon installation of bucket 16 into a motor control center when contact 44 engages a control power bus.

Figure 5:
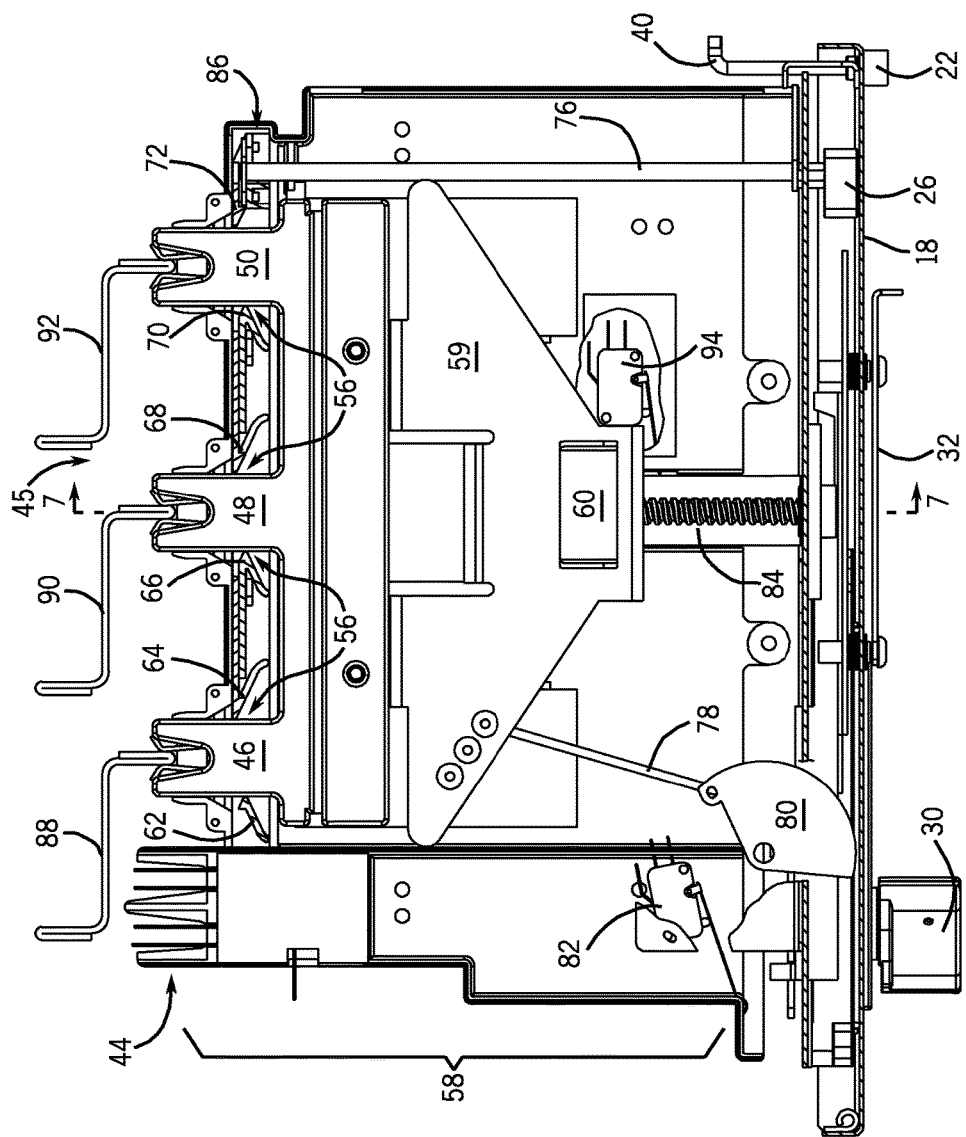
FIG. 5 is a top view of the motor control center subunit of FIG. 4 showing the stabs in an extended position.

FIG. 5 depicts another top view of the bucket 16 wherein the stabs 46, 48, 50 are in an extended/engaged position 45. In operation, stabs 46, 48, 50 are advanced or extended from the test position 43 of FIG. 4 towards shutters 56 and impinge upon angled portions 62-72 of the shutters 56. As the stabs 46, 48, 50 are forced forward into and against the surfaces of shutters 56, the stabs 46, 48, 50 separate the left angled portions 62, 66, 70 and right angled portions 64, 68, 72 of the shutters 56 to expose the stabs 46, 48, 50 to supply power buses 88, 90, 92, respectively. Preferably, a biasing or closure force is provided to bias the right angled portions 64, 68 72 and the left angled portions 62, 66, 70 towards one another, so that the shutters 56 automatically close upon retraction of stabs 46, 48, 50. It is recognized that numerous other ways of opening and closing shutters 56 are possible and contemplated. For example, rather than employing two shutter portions for each shutter, one shutter portion having one beveled surface could be slid aside by the advancement of the stabs. Or, the shutters could be connected for manipulation by the turning of rotary shaft 84. Thus, the shutters 56 could comprise one or several sliding panels with or without beveled surfaces. In other words, shutters 56 may be operated to open and close by the movement of the stabs, by the movement of the stab assembly, by the turning of the actuating shaft, by other actuating components, or by a manual control. Regardless, once the stabs 46, 48, 50 have penetrated through shutters 56, the stabs 46, 48, 50 may be advanced or extended to engage power supply bus bars 88, 90, 92.

Also shown in FIG. 5 is a second microswitch 94 connected to activate and deactivate circuit breaker 30. When stabs 46, 48, 50 reach the fully engaged position 45 with bus bars 88, 90, 92, stab bracket 59 of stab assembly 58 actuates microswitch 94. When actuated, microswitch 94 permits closure of circuit breaker 30, completing the circuit between bus bars 88, 90, 92 and the line side of motor control components (not shown) in bucket 16. Otherwise, microswitch 94 prevents closure of circuit breaker 30.

For removal of bucket 16, circuit breaker 30 is opened, disconnecting supply power to the motor control devices (not shown) of bucket 16. Stabs 46, 48, 50 may then be retracted from bus bars 88, 90, 92 by a reverse motion of rotary shaft 84. Once stabs 46, 48, 50 pass shutters 56, the right and left portions 62-72 thereof will automatically close together to isolate the stabs from bus bars 88, 90, 92. Preferably, the shutter portions 62-72 and all or some of the housing panels, including front panel 18 and a rear panel (not shown), of bucket 16 are formed of plastic or another insulating material. After stabs 46, 48, 50 have been fully refracted, automatic latch 60 will release from engagement with the motor control center, and an operator may then slide bucket 16 out of the motor control center.

Figure 6:
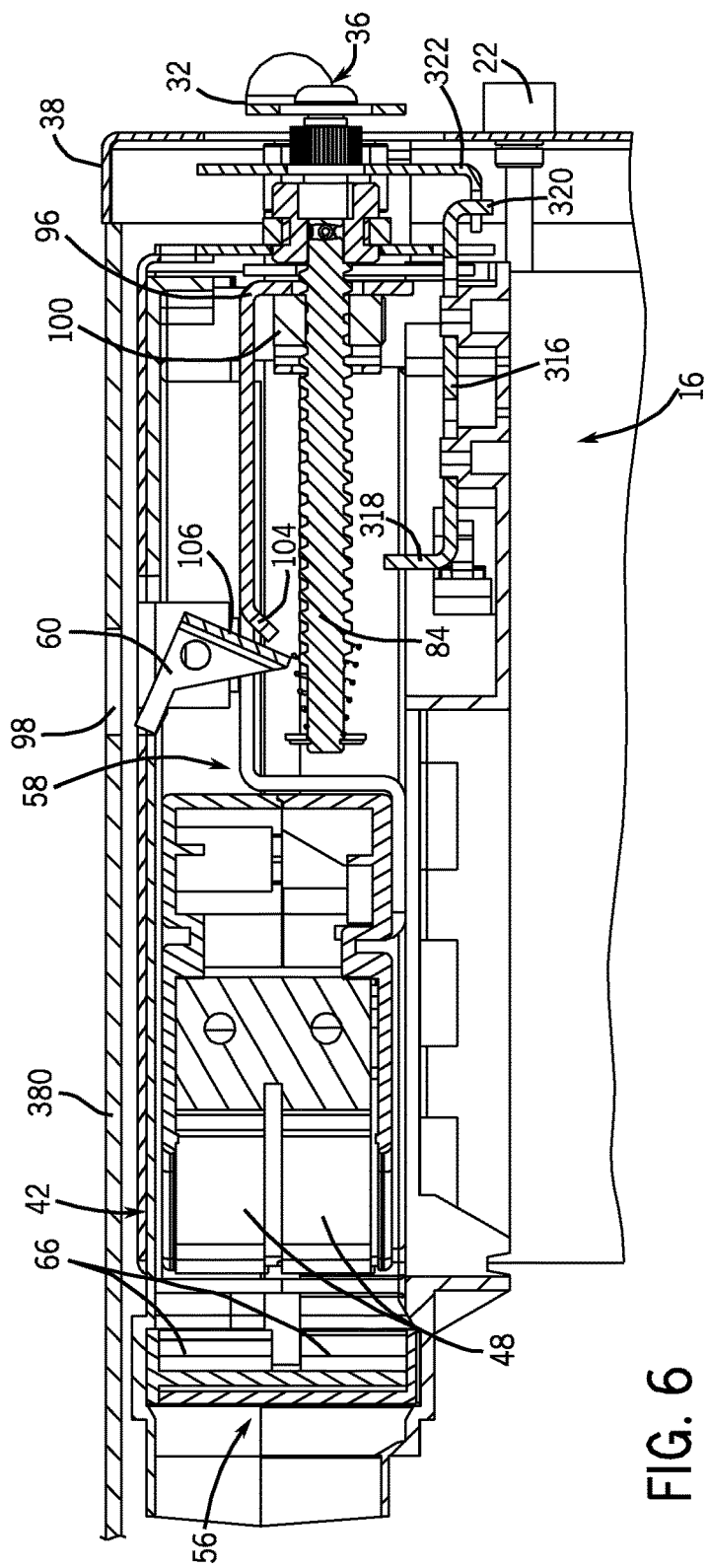
FIG. 6 is a cross-sectional view of the motor control center subunit of FIG. 3 taken along line 6-6 of FIG. 3.

Referring now to FIG. 6, a cross-sectional view of bucket 16 taken along line 6-6 of FIG. 3 is shown. The left angled portion 66 of a shutter 56 is shown isolating the central stab 48, since stab 48 is in the retracted position 42 of FIG. 3. In FIG. 6, it can be seen that stab assembly 58 holds stab 48 in position and engages rotary shaft 84, shown in section. Therefore, FIG. 6 illustrates the moving components used to actuate a stab 48. An operator may use a ratchet or crank (not shown) through opening 36 of slide 32 to turn rotary shaft or worm gear 84. A stab guide 96 includes a thread bearing 100 to transform the rotational motion of rotary shaft 84 into a translational motion of stab assembly 58. Thus, rotary shaft 84 and stab guide 96 may generally be referred to as a racking-type actuating mechanism for extending and retracting the stabs 46, 48, 50, relative to bucket 16. As stab assembly 58 is racked or otherwise advanced towards the extended or engaged position 45 shown in FIG. 5 (i.e. a motion to the left, as oriented in FIG. 6) stab 48 will impinge upon shutters 66.

FIG. 6 also illustrates the operation of a number of interlocks which coordinate installation of the bucket 16 with connection of supply power. That is, based upon the motion of the stab assembly 58, a retention latch 60 is triggered to retain bucket 16 in its installed position inside the motor control center frame 314, followed by a circuit breaker interlock 316 being moved to permit an operator to close circuit breaker handle 30 (FIG. 1). When stab assembly 58 is advanced, a sloped lip 104 of stab assembly 58 will strike a bottom portion 106 of automatic retention latch 60. As sloped lip 104 follows the advancing motion of the stab assembly 58, it will rotate retention latch 60 into an upward position wherein bottom portion 106 rests on stab guide 96 and latch 60 extends through a groove 98 of a divider pan 380 of the motor control center frame (FIG. 1) to retain bucket 16 therein. Additionally, in the embodiment shown, a circuit breaker interlock 316 mechanically prevents an operator from closing a circuit breaker 28 (FIG. 1) when stab assembly 58 is in the retracted position 42. This mechanical embodiment of circuit breaker interlock 316 may be used in addition to, or as an alternative to, the microswitch embodiment shown in FIG. 5. As shown in FIG. 6, circuit breaker interlock 316 has a downward-sloping end 320 and an upward-sloping end 318. The downward-sloping end 320 of circuit breaker interlock 316 acts as a stop, preventing plate 322 from shifting. Plate 322 is interconnected with circuit breaker handle 30 (FIG. 1), so that circuit breaker handle 30 cannot be turned unless plate 322 shifts.

Figure 7:
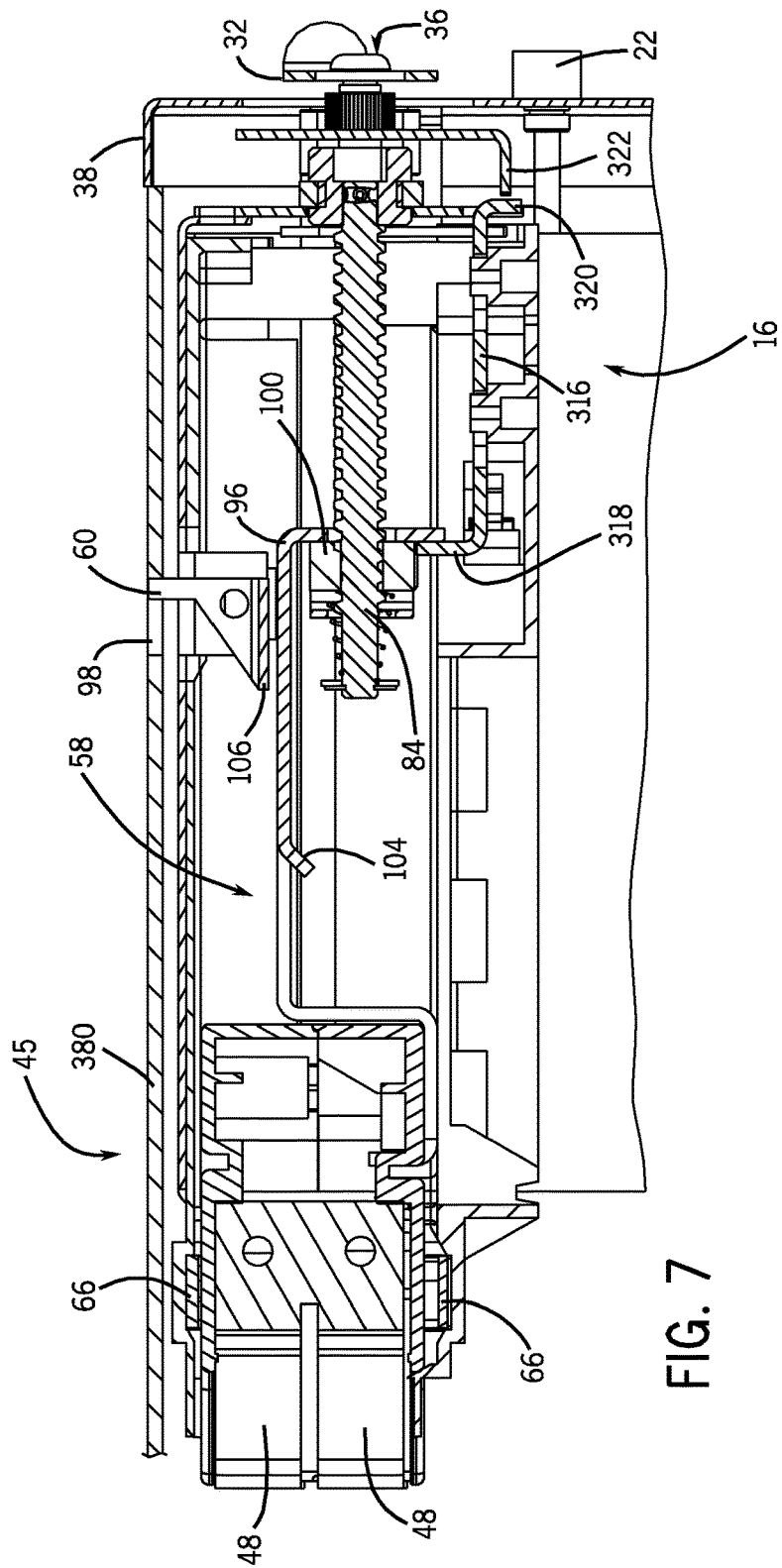
FIG. 7 is a cross-sectional view of the motor control center subunit of FIG. 5 taken along line 7-7 of FIG. 5.

FIG. 7 is another cross-sectional view, showing the same portion of bucket 16 as is shown in FIG. 6. However, FIG. 7 is a cross-section taken along line 7-7 of FIG. 5, thus showing component locations when the stab assembly 58 is in the extended position 45. Stab assembly 58 has been advanced by the turning of worm gear 84 such that stab 48 has separated and pushed past shutters 66. As the stab assembly 58 was advanced, sloped lip 104 of stab assembly 58 lifted bottom portion 106 of retention latch 60, such that retention latch 60 now engages a divider pan 380 through opening 98. Divider pan 380 is connected to the motor control center frame (FIG. 1) to separate two bucket compartments thereof. Thereafter, as the stab assembly 58 reached its fully extended position 45, the stab guide 96 abutted the upward-sloped end 318 of circuit breaker interlock 316, drawing circuit breaker interlock 316 away from plate 322. Thus, downward-sloped end 320 of circuit breaker interlock 316 no longer blocks shifting of plate 322 when stab assembly 58 is in the extended/engaged position 45. In other words, installation and power connection are coordinated in that a user cannot remove the bucket 16 from the motor control center once the automatic retention latch is triggered, and can only turn the circuit breaker handle 30 (FIG. 1) when the stab assembly reaches its extended position 45.

Figure 8:
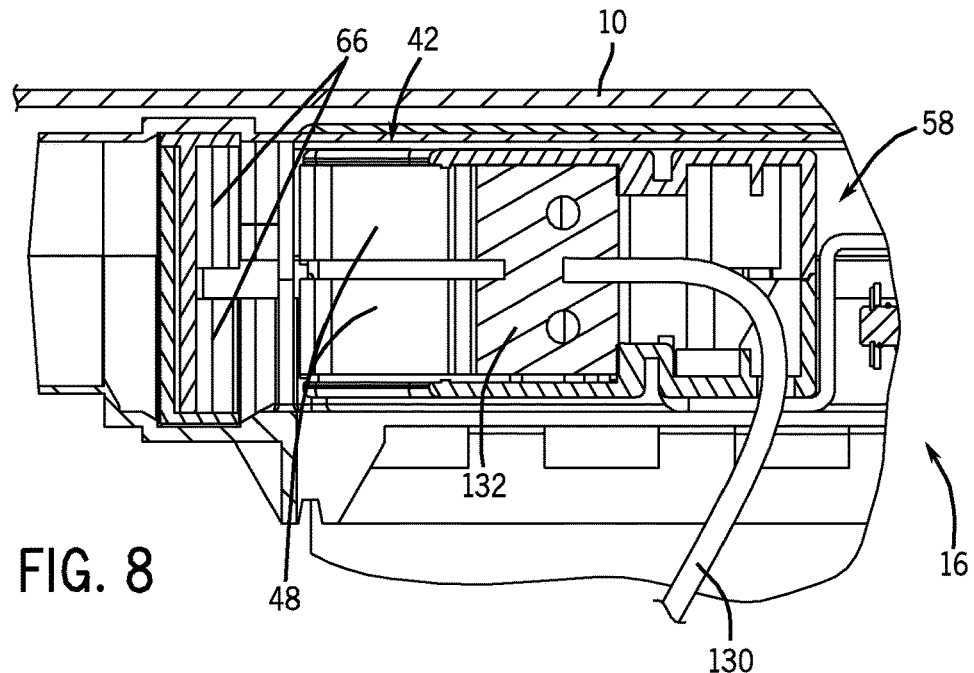
FIG. 8 is a detailed view of a portion of the motor control center subunit of FIG. 6 showing an arc shield, line contact, and supply conductor thereof.
Figure 9:
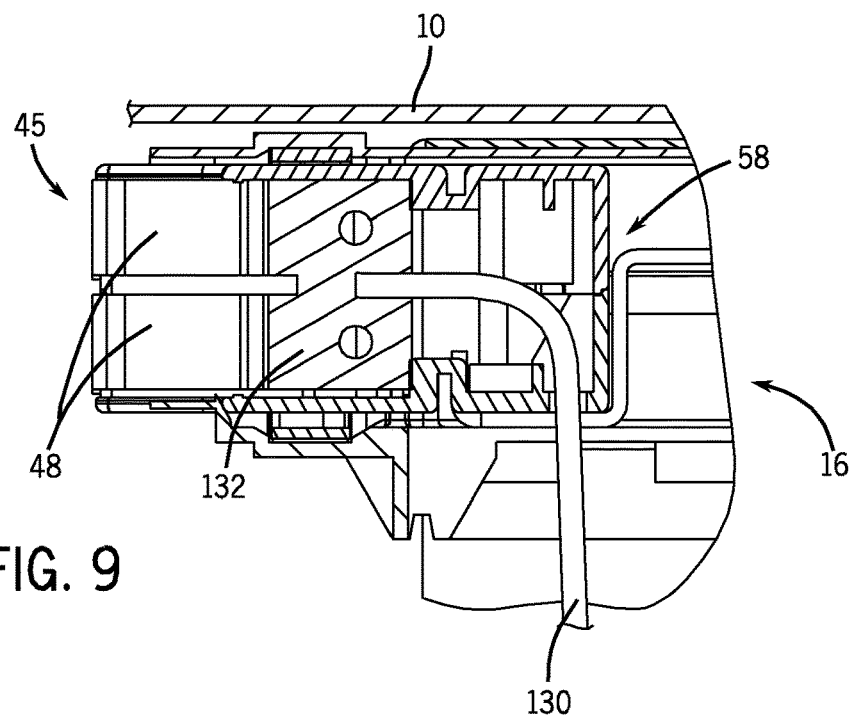
FIG. 9 is a detailed view of a portion of the motor control center subunit of FIG. 7 showing a line contact and supply conductor thereof.

FIG. 8 is an enlarged view of the stab 48 and shutter 66 area of the cross-sectional view of FIG. 6. Conductive stab 48 is coupled to a flexible conductor 130, such as a cable, via a coupling portion 132 of stab assembly 58. Flexible conductor 130 is of a construction suitable to conduct supply power, via stab 48, to the line side of a motor control component (not shown). As shown in FIG. 9, when stab 48 and stab assembly 58 are racked or otherwise advanced forward to an extended position 45, flexible conductor 130 flexes to maintain electrical connectivity with stab 48 via coupler 132. Accordingly, the motion of stab 48 relative to bucket 16 does not interfere with the connectivity of the stab 48 with a motor control component.

Figure 10:
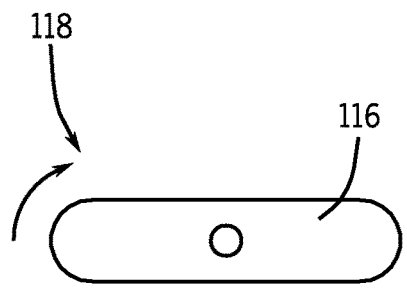
FIG. 10 is a plan view of a control handle of one embodiment of the present invention.
Figure 11:
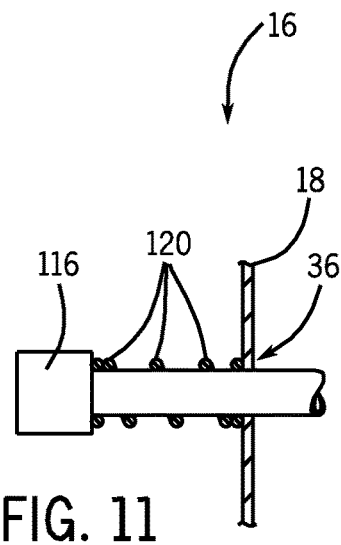
FIG. 11 is a side view of the control handle of FIG. 9.
Figure 12:
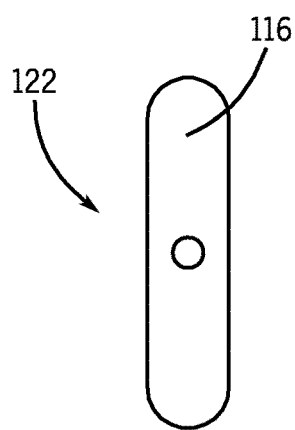
FIG. 12 is a plan view showing the control handle of FIG. 9 rotated ninety degrees.
Figure 13:
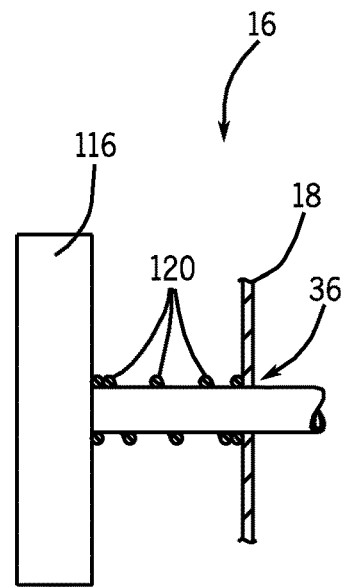
FIG. 13 is a side view of the control handle of FIG. 11.
Figure 14:
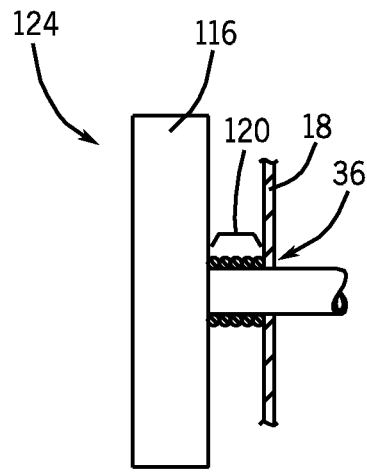
FIG. 14 is a side view showing the control handle of FIG. 11 depressed into a motor control center subunit.
Figure 15:
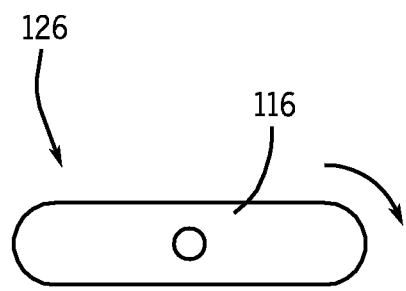
FIG. 15 is a plan view showing the control handle of FIG. 11 rotated ninety degrees.
Figure 16:
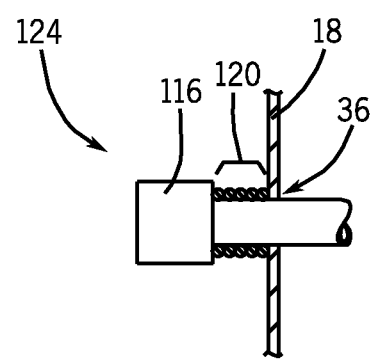
FIG. 16 is side view of the control handle of FIG. 14.

Referring now to FIGS. 10-16, an alternative stab actuating feature is shown. A manually drivable handle 116 may replace or be used in combination with the crank 34, the crank 300, the motor drive 308, or the motor drive 312 of FIG. 1 and the racking mechanism of FIG. 6. In such embodiments, the rotary shaft or worm gear 84 depicted in previous embodiments may be replaced with a non-tapped shaft or rod directly connected to stab assembly 58. FIG. 10 shows such a handle 116 in a locked, starting position 118 that corresponds to the stabs disengaged position 42 of FIG. 3. As shown in FIG. 11, handle 116 is separated and biased from front panel 18 of a bucket by a spring 120 and extends through stab actuating opening 36. By rotating handle 116 ninety degrees, as shown in FIGS. 12 and 13, handle 116 may be unlocked 122. In some embodiments, an interlock system may be included to prevent unlocking of handle 116 until bucket 16 is fully installed into a motor control center. Such an interlock may be incorporated into the shaft 84 of handle 116. Once unlocked, handle 116 may be driven or depressed towards front panel 16, compressing spring 120, as shown in FIG. 14. The depressed position 124 of handle 116 corresponds to the stabs engaged position of FIG. 5. Handle 116 may then be rotated another ninety degrees 126, as shown in FIGS. 15 and 16, to lock the handle in the stabs engaged position 124, against the force of spring 120. For disengagement of the stabs, handle 116 is rotated to unlocked orientation 122, pulled outward to the stab disengaged position 42 and turned ninety degrees to a locked position 118. In a general sense, therefore, embodiments of the present invention may include various configurations of simplified, manual actuation of the stabs, similar to that shown in FIGS. 10-16.

Figure 17:
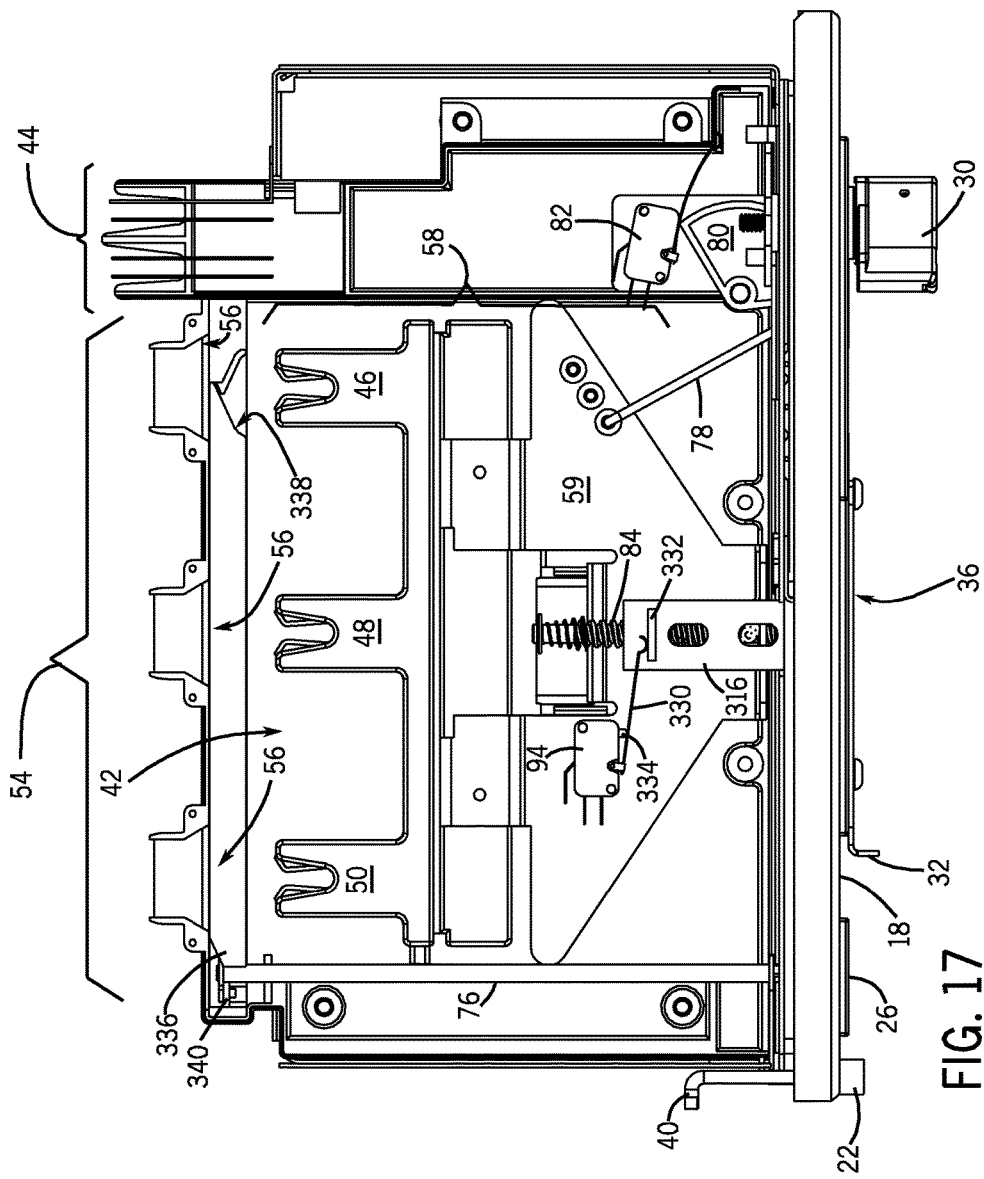
FIG. 17 is a bottom view of the motor control center subunit of FIG. 3.

Referring now to FIG. 17, a bottom view of the bucket 16 of FIG. 3 is shown, wherein the stab assembly 58 and stabs 46, 48, 50 are in a retracted position 42. In retracted position 42, shutters 56 of shutter assembly 54 are closed, isolating or shielding stabs 46, 48, 50 inside bucket 16. Control power stab 44, on the other hand, is un-shielded and will be connected to a control power once bucket 16 is installed into a motor control center. However, microswitch 82 is in an activated state, due to the pressure thereon by cam 80. When microswitch 82 is in the activated state, as shown, microswitch 82 is interrupting control power from contact 44. Thus, the motor control components (not shown) housed in bucket 16 cannot initially be operated. Cam 80 will be moved by rod 78 via advancement of stab bracket 59, deactivating microswitch 82 and thereby permitting the flow of control power to motor control components (not shown) of the bucket 16. Cam 80 also acts to display a location status of the stabs 46, 48, 50 to an operator. As will be discussed below, cam 80 has a number of colors printed thereon which are displayed through front door 18 of bucket 16 via stab indicator 24 (FIG. 1).

In the embodiment shown, circuit breaker interlock 316 includes microswitch 94, which gates the operation of circuit breaker 30. FIG. 17 shows microswitch 94 in a deactivated state, in which button 334 thereof is not depressed. Arm 330 of microswitch 94 is positioned to abut a ledge 332 of circuit breaker interlock 316 Thus, when circuit breaker interlock 316 moves, due to the motion of stab assembly 58, the arm 330 of microswitch 94 will pivot, depressing button 334. When button 334 is depressed, microswitch 94 will be activated and will electrically enable operation of circuit breaker 28 (FIG. 1).

Also shown in FIG. 17 is a shutter arm 336, having a sloped end 338. As stab 46 is advanced, stab 46 will engage the sloped end 338 and slide past shutter arm 336, thereby shifting shutter arm 336 to the left, as depicted in FIG. 17. When shutter arm 336 is shifted, it will strike a tab 340 of rod 76. As will be further described below, when tab 340 is struck, rod 76 will rotate, changing the color showing on shutter indicator 26 through door 18 of bucket 16.

Figure 18:
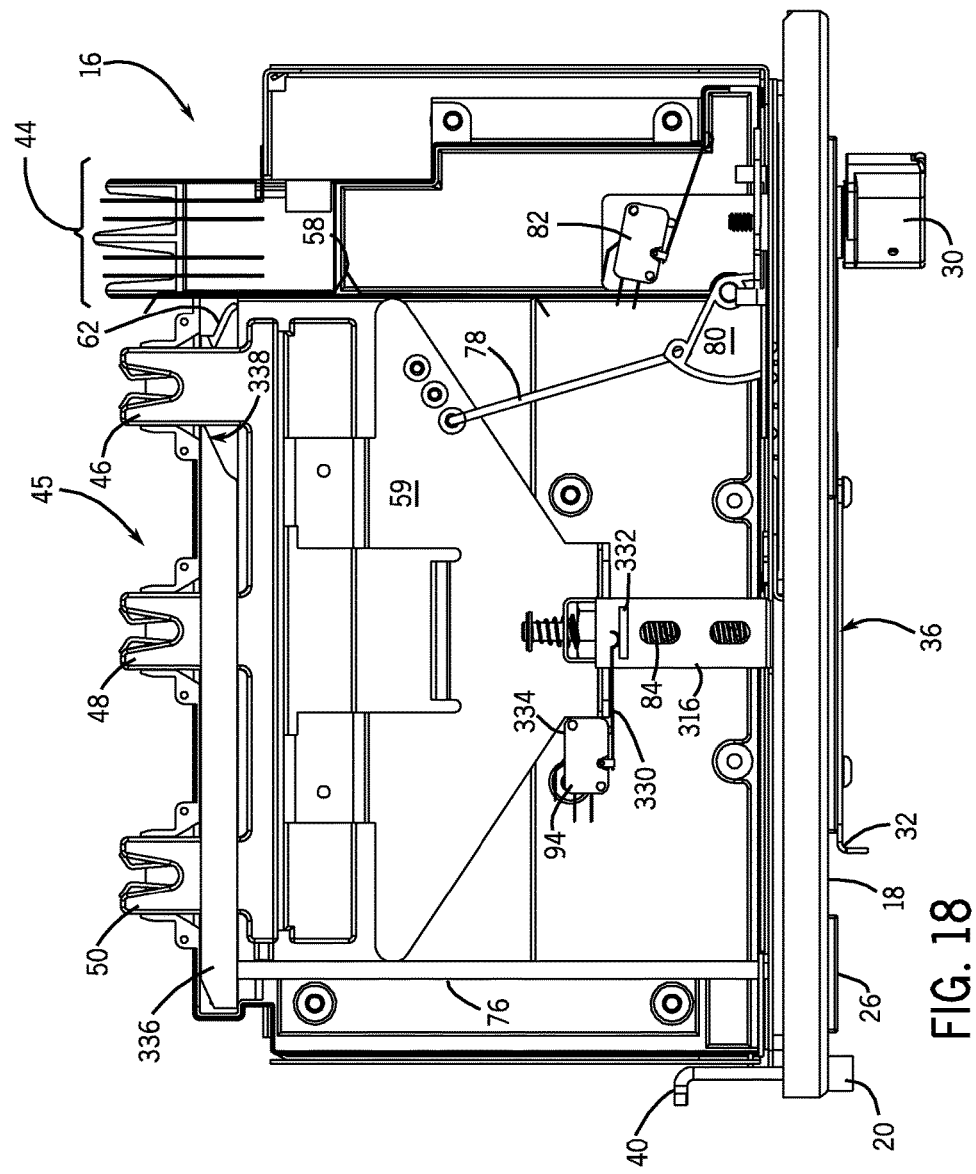
FIG. 18 is a bottom view of the motor control center subunit of FIG. 5.

FIG. 18 is a bottom view of the bucket 16 of FIG. 5, illustrating the location of components thereof when the stab assembly 58 is in the extended/engaged position 45. When stab assembly 58 was advanced, rod 78 caused cam 80 to rotate, releasing pressure on microswitch 82. Thus, microswitch 82 is shown in a deactivated state, permitting the flow of control power from control power contact 44 to motor control components (not shown) of bucket 16. Additionally, the advancement of stab assembly 58 moved circuit breaker interlock 316 such that ledge 332 thereof drew arm 330 of microswitch 94 to an activated position. That is, arm 330 of microswitch 94 is depressing button 334 to enable operation of circuit breaker 30, now that stabs 46, 48, 50 are in the engaged position 45.

As discussed above, the advancement of stabs 46, 48, 50 to the extended position 45 separates a number of shutter portions, including shutter portion 62. In the embodiment shown in FIG. 18, the advancement of stab 46 also caused a shift in shutter arm 336. That is, stab 46 impinged upon sloped end 338 of shutter arm 336 and drove shutter arm 336 to the left, as depicted in FIG. 18, as stab 46 advanced. When shutter arm 336 shifted due to the motion of stab 46, shutter arm 336 struck a tab 340 (FIG. 17) of rod 76, rotating rod 76 and altering the color of shutter indicator 26.

Figure 19:
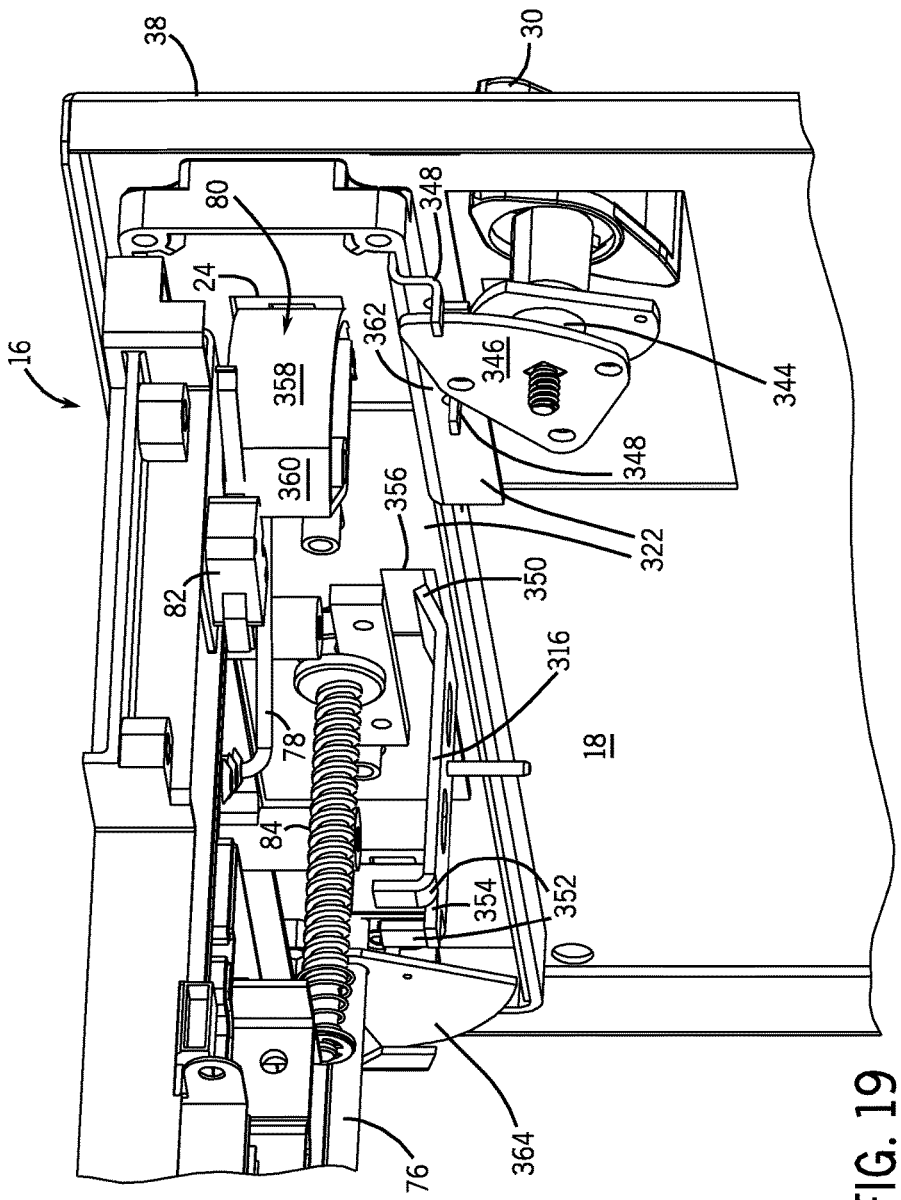
FIG. 19 is a rear perspective view of the motor control center subunit of FIG. 2.

Referring now to FIG. 19 a partial interior perspective view of a motor control center bucket 16 is shown. For purposes of illustration, several components are not shown, including side panels, a top panel, a stab guide, and a circuit breaker assembly. Therefore, circuit breaker handle 30 is visible through front door 18 of bucket 16. As shown, handle 30 is attached via a shaft 344 to a fin 346. Though not shown, a circuit breaker assembly is also attached to be actuated by shaft 344.

Circuit breaker interlock 316 is shown in an alternate configuration, having an upward-sloping end 350 near door 18 and a pair of vertical tines 352 and one horizontal tine 354 at an opposite end. Vertical tines 352 are engaged by a stab guide 96 (FIG. 7) when the stabs of bucket 16 are advanced. Horizontal tine 354 engages a spring (not shown) to bias the circuit breaker interlock 316 toward door 18 until the stabs of bucket 16 are advanced. Until the circuit breaker interlock 316 is slid away from door 18 by advancement of the stabs, upward-sloping end 350 of circuit breaker interlock 316 is inserted into an opening 356 of interlock plate 322. Because upward-sloping end 350 is inserted into opening 356, interlock plate 322 is prevented from shifting side-to-side, until circuit breaker interlock 316 is pulled away from door 18 by the advancement of the stabs of bucket 16.

Interlock plate 322 has a projection 362 extending therefrom to fin 346 of circuit breaker handle 30. Projection 362 is integrally formed with, or affixed to, plate 322, and is configured to move side-to-side with plate 322, when upward-sloping end 350 of circuit breaker interlock 316 is not inserted in opening 356. Projection 362 has a pair of tines 348 which extend outwardly therefrom, on either side of fin 346. Therefore, when plate 322 is prevented from moving, tines 348 prevent fin 346 from rotating, thereby preventing an operator from turning circuit breaker handle 30. In this manner, circuit breaker interlock 316 prevents a user from closing circuit breaker handle 30 until the stabs of bucket 16 are fully extended. It is understood that circuit breaker interlock 316, interlock plate 322, and associated components may have a number of shapes, orientations, and configurations which allow for the functionality described herein.

When an operator closes circuit breaker handle 30, fin 346 impinges upon the tines 348 of projection 362 in a counterclockwise direction. The force of fin 346 on tines 348 causes projection 362 and interlock plate 322 to shift to the left, as orientated in FIG. 19. When plate 322 shifts left, it obscures opening 36 of actuating assembly 31 (FIG. 1), obstructing access to worm gear 84. So long as circuit breaker handle 30 is closed, fin 346 will prevent plate 322 from moving back to the right, as shown in FIG. 19. In other words, fin 346 of circuit breaker handle 30 effectively prevents a user from moving the stabs of bucket 16 while the circuit breaker is closed and supply power is conducting. Once circuit breaker handle 30 is opened again, fin 346 will not press on tines

348, plate 322 will be permitted to shift back to the position shown in FIG. 19, and an operator will again have access to worm gear 84. When the operator reverses worm gear 84 to withdraw the stabs, circuit breaker interlock 316 will be biased back toward plate 322, preventing plate 322 from sliding, and thus preventing circuit breaker handle 30 from turning.

Also shown in FIG. 19 is cam 80 and rod 78. As discussed above with respect to FIGS. 3 and 4, rod 78 is connected to translate movement of the stabs of bucket 16 to a rotational motion of cam 80. Cam 80 serves two purposes: to activate and deactivate microswitch 82, as described above, and to control the stab location status shown on stab indicator 24. Therefore, cam 80 has a number of colors printed on its edge. Visible in FIG. 19 are a red edge section 360 and a yellow edge section 358. A green edge section (not shown) is currently being presented at stab indicator 24, to indicate the stabs refracted position 42 of FIG. 3. Yellow edge section 358 will be presented at stab indicator 24 when the stabs have left the retracted position and are advanced towards the test position 43 of FIG. 4. Red edge section 360 will be presented at stab indicator 24 when the stabs have reached the extended/engaged position 45 of FIG. 5.

Similarly, rod 76 of shutter indicator 26 (FIG. 4) is connected to a wheel 362, which presents a number of colors at shutter indicator 26, to indicate the status of the shutter assembly 54 (FIG. 3). That is, as described with respect to FIG. 18, the movement of stab assembly 58 causes a rotation in rod 76. As depicted in FIG. 19, rod 76 is affixed to wheel 364 such that a rotation of rod 76 causes wheel 364 to turn.

Figure 20:
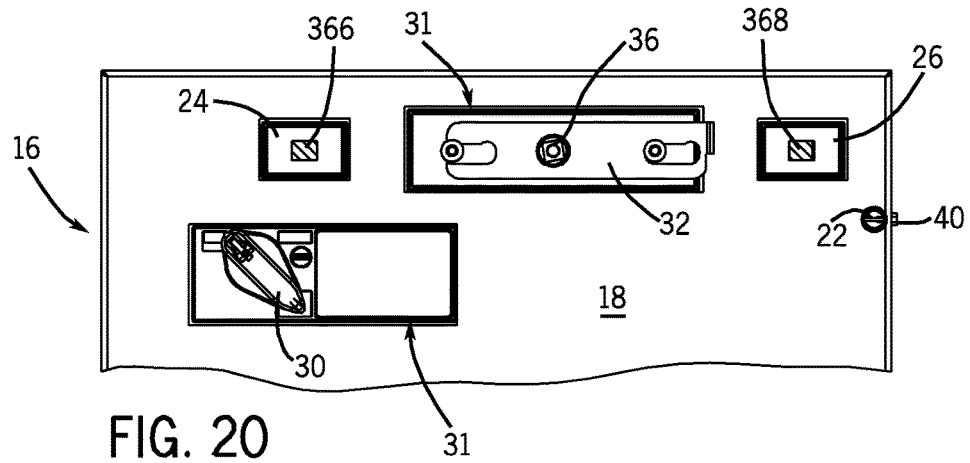
FIG. 20 is a front view of the motor control center subunit of FIG. 3.
Figure 21:
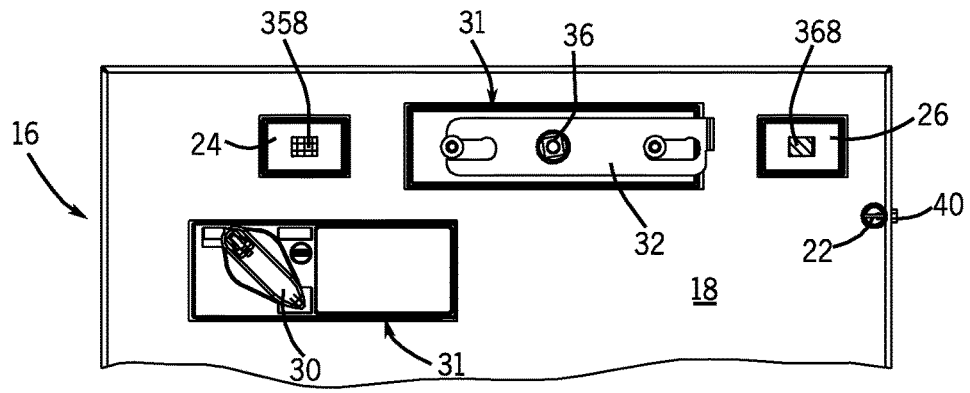
FIG. 21 is a front view of the motor control center subunit of FIG. 4.
Figure 22:
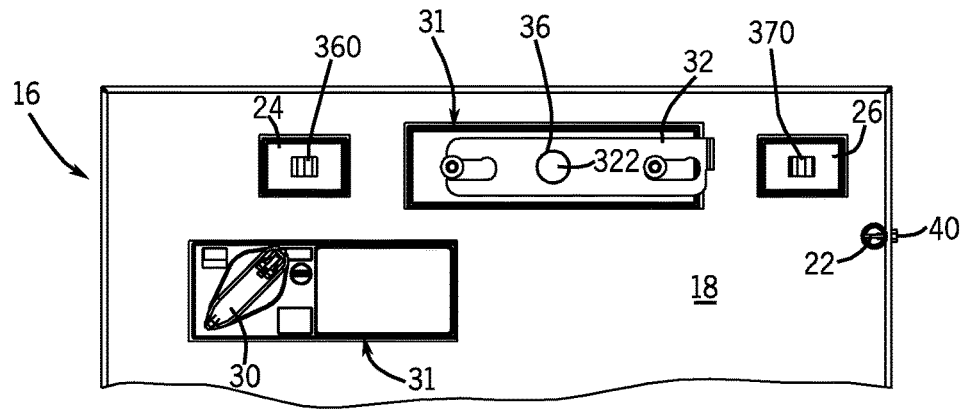
FIG. 22 is a front view of the motor control center subunit of FIG. 5.

Referring now to FIGS. 20-22, the status indicating features of stab indicator 24 and shutter indicator 26 are shown. That is, FIGS. 20, 21, and 22 are a front view of the bucket 16 shown in FIGS. 3, 4, and 5, respectively. With respect to FIG. 20, a user has moved slide 32 of actuating assembly 31 to the right, exposing opening 36. In alternative embodiments, a user may need to unlock a cover or padlock (not shown) which restrict movement of or access to the slide 32. As shown, slide 32 overlaps door 18, preventing a user from opening door 18 while opening 36 is exposed. Shutter indicator 26 is displaying a green "shutters closed" status 368, since the shutters 56 are closed due to the stabs retracted position 42 of FIG. 3. Therefore, FIG. 20 also shows stab indicator 24 displaying a green "stabs refracted" status, corresponding to the stabs retracted position 42 of FIG. 3. FIG. 21 also shows the green "shutters closed" status 368 on shutter indicator 24, but shows a yellow "test position" status on the stab indicator 24, corresponding to the test position 43 of FIG. 4.

FIG. 22 shows a front view of bucket 16 when the stabs are in the extended/engaged position 45 of FIG. 5. Therefore, shutter indicator 26 now displays a red "shutters open" status 370, since the stabs 46, 48, 50 have separated the shutters 56 (FIG. 5), and the stab indicator 24 of FIG. 22 shows a red "stabs engaged" status 360. Circuit breaker handle 30 has been turned, closing the circuit breaker 31 and permitting the flow of supply power to motor control components inside bucket 16. As described above with respect to FIG. 19, turning circuit breaker handle 30 when the stabs are engaged causes interlock plate 322 to be shifted by movement of circuit breaker fin 346. Accordingly, FIG. 22 illustrates that actuating assembly opening 36 is now obscured by interlock plate 322. It is understood that further measures, such as padlocking a cover over actuating mechanism 31 and slide 32, may also be made to further restrict access to the actuating mechanism 31 when the bucket 16 is connected to supply power.

Thus, an interlock system has been disclosed, in a number of embodiments, which coordinates the installation and power connections of a motor control center subunit or bucket. When a user slides the bucket completely into the enclosure of a motor control center, the line contacts or stabs of the bucket are shielded from the bus bars. Once the bucket is inserted into the enclosure, the front door of the bucket must be closed and the circuit breaker must be off/open in order for the operator to have access to the stab actuating mechanism. Additionally, a user may have to unlock a padlock and latch to gain access to the slide and/or actuating mechanism. Once the actuating mechanism opening is exposed, a crank (or motor drive) may be connected thereto. The stab indicator will show a green "stabs-disengaged" status, and the shutter indicator will show a green "shutters-closed" status. As the stabs are initially advanced, an automatic retention latch is triggered to engage the frame of the motor control center and prevent removal of the bucket therefrom. Also, a micro-switch is activated by the initial advancement of the stabs, turning on control power for the motor control components inside the bucket. When the line stabs reach the back of the bucket, but have not moved past the shielding shutters, the bucket is in the "test" position. The stab indicator will show a yellow "test" status, and the shutter indicator will still show a green "shutters-closed" status. When the stabs are advanced further, they will open the shutters, causing the shutter indicator to show a red "shutters-open" status. When the shutters reach and engage the bus bars, the stab indicator will show a red "stabs-engaged" status and the circuit breaker interlock will be tripped. At this point, the circuit breaker will be permitted to close once the user removes the crank or motor from the actuating mechanism. When a user closes the circuit breaker, access to the actuating mechanism will be obscured by a circuit breaker interlock plate. The circuit breaker handle and/or the actuating mechanism slide can be padlocked in place at this point to maintain the engaged, operating state now achieved. Moreover, it is understood that the interlock system thus disclosed also coordinates the power disconnection and removal of the bucket from the motor control center, by reverse operation of the aforementioned interlocks and indicators.

Accordingly, one embodiment of the present invention includes a motor control center subunit having a subunit housing, an actuating mechanism, and an interlock system. The subunit housing is configured to fit within a motor control center. The actuating mechanism is attached to the subunit housing and is constructed to move at least one conductive contact to engage and disengage a supply power of the motor control center. The interlock system is arranged to coordinate installation of the subunit housing into the motor control center with connection of the supply power to motor control components of the subunit housing.

In accordance with another embodiment of present invention, a motor control center includes a frame having at least one compartment and a subunit constructed to seat in the at least one compartment of the motor control center frame. An actuating mechanism is attached to the motor control center subunit to control movement of a plurality of conductive contacts and an interlock is configured to prevent actuation of the actuating mechanism until the motor control center subunit is seated in at least one compartment.

In another embodiment of the present invention, a method of manufacturing an interlock system for a motor control center is provided. The method includes constructing a motor control center subunit to seat within a motor control center and restricting engagement of a plurality of movable contacts of the subunit with a supply bus of the motor control center dependent upon a state of at least one interlock.

The present invention has been described in terms of the preferred embodiment, and it is recognized that equivalents, alternatives, and modifications, aside from those expressly stated, are possible and within the scope of the appending claims.

What is claimed is:

1. A control module for a motor control center comprising:
   a housing constructed to be received within a frame of the motor control center;
   a stab assembly comprising:
      a stab guide; and
      at least one line contact coupled to the stab guide, the at least one line contact moveable between a retracted position and an extended position; and
   a rotatable latch disposed proximate a top surface of the stab guide, wherein the rotatable latch comprises a base plate and a pair of side plates extending upward from the base plate.

2. The control module of claim 1 wherein the rotatable latch is moveable between a first position and a second position;
   wherein the rotatable latch engages the frame of the motor control center in the first position; and
   wherein the rotatable latch is disengaged with the frame of the motor control center in the second position.

3. The control module of claim 1 further comprising a drive mechanism coupled to the stab guide.

4. The control module of claim 3 wherein the drive mechanism comprises a rotary drive.

5. The control module of claim 4 further comprising:
   a threaded bearing coupled to the stab guide and threadedly engaged with the rotary drive; and
   a front panel coupled to the housing, wherein a first end of the rotary drive is accessible through an opening in the front panel.

6. The control module of claim 1 wherein the rotatable latch translates between a first end of the top surface of the stab guide and a second end of the top surface of the stab guide as the at least one line contact is moved between the retracted position and the extended position.

7. A motor control center comprising:
   a motor control center frame having a plurality of control module openings, each control module opening having therein at least one bus bar connected to line power and a plurality of internal walls defining a control module cavity, and wherein at least one internal wall has a retention latch opening therein; and
   a plurality of motor control buckets, each motor control bucket comprising:
      a stab assembly having at least one conductive contact engagable with the at least one bus bar in the control module cavity; and
      a racking mechanism mounted to the motor control bucket and connected to the stab assembly within the motor control bucket to advance and retract the at least one conductive contact with regard to the at least one bus bar of the motor control center frame; and
      a retention latch connected to the racking mechanism and positioned adjacent an outer surface of the motor control bucket and the retention latch opening of the motor control center frame, the retention latch having a retracted position when the racking mechanism is retracted allowing insertion of the motor control bucket into the control module cavity of the motor control center frame, and an engaged position wherein at least a portion of the retention latch extends beyond an outer periphery of the motor control bucket when the racking mechanism is advanced.

8. The motor control center of claim 7 wherein the retention latch engages an outer surface edge of the motor control center frame to prevent insertion of the motor control bucket into the control module cavity of the motor control center frame when in an engaged position.

9. The motor control center of claim 7 wherein and retention latch prevents removal of the motor control bucket from the control module cavity of the motor control center frame when in the engaged position; and
   wherein the portion of the retention latch extending beyond the outer periphery of the motor control bucket is engaged into the retention latch opening of the motor control center frame.

10. The control module of claim 1 wherein the rotatable latch extends outside the housing through an opening in a top panel of the housing.

11. A control module for a motor control center comprising:
    a housing constructed to be received within a frame of the motor control center;
    a stab assembly comprising:
       a stab guide; and
       at least one line contact coupled to the stab guide, the at least one line contact moveable between a retracted position and an extended position; and
    a rotatable latch disposed proximate a top surface of the stab guide, wherein the rotatable latch comprises a first surface that engages the frame of the motor control center and a second surface that translates across the top surface of the stab guide.

12. The control module of claim 11 wherein the rotatable latch extends outside the housing through an opening in a top panel of the housing.

13. The control module of claim 11 wherein the rotatable latch comprises a base plate and a pair of side plates extending upward from the base plate.

14. The control module of claim 11 further comprising a drive mechanism coupled to the stab guide.

15. A control module for a motor control center comprising:
    a housing constructed to be received within a frame of the motor control center;
    a stab assembly comprising:
       a stab guide; and
       at least one line contact coupled to the stab guide, the at least one line contact moveable between a retracted position and an extended position; and
    a rotatable latch disposed proximate a top surface of the stab guide, wherein the rotatable latch translates between a first end of the top surface of the stab guide and a second end of the top surface of the stab guide as the at least one line contact is moved between the retracted position and the extended position.

16. The control module of claim 15 wherein the rotatable latch extends outside the housing through an opening in a top panel of the housing.

17. The control module of claim 15 wherein the rotatable latch comprises a base plate and a pair of side plates extending upward from the base plate.

18. The control module of claim 15 wherein the rotatable latch comprises a first surface that engages the frame of the motor control center and a second surface that translates across the top surface of the stab guide.

19. The control module of claim 15 wherein the first end of the top surface of the stab guide comprises a downward facing surface.

20. The control module of claim 15 further comprising a drive mechanism coupled to the stab guide.

* * * * *